(12) United States Patent
Iwashita et al.

(10) Patent No.: US 7,033,521 B2
(45) Date of Patent: Apr. 25, 2006

(54) PIEZOELECTRIC ACTUATOR, INK JET HEAD, AND DISCHARGE APPARATUS

(75) Inventors: Setsuya Iwashita, Hirasaki (JP); Takamitsu Higuchi, Matsumoto (JP); Hiromu Miyazawa, Toyoshina-machi (JP)

(73) Assignee: Seiko Epson Corporation, (JP)

( * ) Notice: Subject to any disclaimer, the term of this patent is extended or adjusted under 35 U.S.C. 154(b) by 371 days.

(21) Appl. No.: 10/396,115

(22) Filed: Mar. 25, 2003

(65) Prior Publication Data

US 2004/0084994 A1 May 6, 2004

(30) Foreign Application Priority Data

Mar. 27, 2002 (JP) ............................. 2002-089804
Mar. 19, 2003 (JP) ............................. 2003-076244

(51) Int. Cl.
*H01L 41/187* (2006.01)
*H01I 41/04* (2006.01)
*B41J 2/045* (2006.01)
*B32B 15/00* (2006.01)

(52) U.S. Cl. ................. 252/62.9 R; 310/311; 310/363; 310/358; 347/72; 257/295; 428/615; 428/632

(58) Field of Classification Search ........... 252/62.9 R; 310/311, 363, 358; 347/72; 257/295; 428/615, 428/632

See application file for complete search history.

(56) References Cited

U.S. PATENT DOCUMENTS

| 5,739,563 | A | * | 4/1998 | Kawakubo et al. ......... 257/295 |
| 6,169,355 | B1 | | 1/2001 | Furlani et al. |
| 6,186,618 | B1 | * | 2/2001 | Usui et al. .................... 347/70 |
| 6,198,120 | B1 | * | 3/2001 | Sakurai et al. ................. 438/3 |
| 6,510,074 | B1 | | 1/2003 | Miyazawa et al. |
| 6,667,182 | B1 | * | 12/2003 | Li et al. ......................... 438/3 |
| 2002/0006733 | A1 | * | 1/2002 | Noguchi et al. ............. 438/728 |

FOREIGN PATENT DOCUMENTS

| JP | 04-052144 | * | 2/1992 |
| JP | 2001-267645 | * | 9/2001 |
| JP | 2001-313429 | * | 11/2001 |
| JP | 2001-3133429 | | 11/2001 |
| JP | 2002-076294 | * | 3/2002 |

* cited by examiner

*Primary Examiner*—Mark Kopec
*Assistant Examiner*—Kallambella Vijayakumar
(74) *Attorney, Agent, or Firm*—Harness, Dickey & Pierce, P.L.C.

(57) ABSTRACT

A piezoelectric actuator includes: a buffer layer that is composed of an oxide or a nitride epitaxially formed on a Si substrate; a bottom electrode formed on the buffer layer, being composed of a transition metal oxide, and having a pseudo-cubic (100) or (111) orientation with a perovskite structure; a piezoelectric layer formed on the bottom electrode being composed of $(Ba_{1-x}M_x)(Ti_{1-y}Z_y)O_3$ (where (M=Sr or Ca and $0 \leq x \leq 0.3$) (Z=Zr or Hf and $0 \leq y \leq 0.2$)) with a pseudo-cubic (001) or (111) orientation; and a top electrode that is formed on the piezoelectric layer. In this way, a piezoelectric actuator that uses barium titanate as the piezoelectric body and does not include Pb is provided.

13 Claims, 5 Drawing Sheets

1 INK JET RECORDING HEAD

PIEZOELECTRIC ACTUATOR, INK JET HEAD, AND DISCHARGE APPARATUS

FIELD OF THE INVENTION

The present invention relates to a piezoelectric actuator that is equipped with a piezoelectric body and a pair of electrodes that are disposed on each side of the piezoelectric body, an ink jet head that uses this piezoelectric actuator, and a discharge apparatus that uses this ink jet head. In particular, the invention relates to a piezoelectric actuator that uses a piezoelectric body that does not include Pb, an ink jet head that uses this piezoelectric actuator, and a discharge apparatus that uses this ink jet head.

BACKGROUND OF THE INVENTION

A piezoelectric actuator includes a piezoelectric element in which a piezoelectric film that functions as an electromechanical transducer is sandwiched between two electrodes, with the piezoelectric film being composed of crystallized piezoelectric ceramics. Conventionally, PZT that includes Pb has been widely used as such piezoelectric ceramics due to its high performance.

However, Pb is harmful to many living things, and from the viewpoint of environmental protection, the development of a high-performance piezoelectric actuator that does not use Pb is desired.

SUMMARY OF THE INVENTION

It is an object of the present invention to provide a piezoelectric actuator that uses barium titanate as the piezoelectric body. In addition, it is a further object to provide an ink jet head and a discharge apparatus that are equipped with this piezoelectric actuator.

A piezoelectric actuator according to a first aspect of the present invention includes a buffer layer that is composed of an oxide that is epitaxially formed on a Si substrate with (100) or (110) orientation. a bottom electrode that is formed on the buffer layer that is composed of a transition metal oxide and has a pseudo-cubic (100) orientation with a perovskite structure, and a piezoelectric layer that is formed on the bottom electrode and is composed of $(Ba_{1-x}M_x)(Ti_{1-y}Z_y)O_3$ (where (M=Sr or Ca and $0 \leq x \leq 0.3$) (Z=Zr or Hf and $0 \leq y \leq 0.2$)) with a pseudo-cubic (001) orientation. Further, a top electrode is formed on the piezoelectric layer.

A piezoelectric actuator according to a second aspect of the present invention includes a buffer layer that is composed of an oxide that is epitaxially formed on a Si substrate, a bottom electrode that is formed on the buffer layer which is composed of a transition metal oxide and has a pseudo-cubic (111) orientation with a perovskite structure, and a piezoelectric layer that is formed on the bottom electrode and is composed of $(Ba_{1-x}M_x)(Ti_{1-y}Z_y)O_3$ (where (M=Sr or Ca and $0 \leq x \leq 0.3$) (Z=Zr or Hf and $0 \leq y \leq 0.2$)) that has pseudo-cubic (111) orientation. Further, a top electrode is formed on the piezoelectric layer.

A piezoelectric actuator according to a third aspect of the present invention includes a buffer layer that is composed of an oxide or a nitride that is epitaxially formed on a Si substrate with (100) or (110) orientation, a bottom electrode that is formed on the buffer layer and includes a metal with (100) orientation, and a piezoelectric layer that is formed on the bottom electrode and is composed of $(Ba_{1-x}M_x)(Ti_{1-y}Z_y)O_3$ (where (M=Sr or Ca and $0 \leq x \leq 0.3$) (Z=Zr or Hf and $0 \leq y \leq 0.2$)) that has pseudo-cubic (001) orientation. Moreover, a top electrode is formed on the piezoelectric layer.

A piezoelectric actuator according to a fourth aspect of the present invention includes a buffer layer that is composed of an oxide or a nitride that is epitaxially formed on a Si substrate, a bottom electrode that is formed on the buffer layer and includes a metal with (111) orientation, and a piezoelectric layer that is formed on the bottom electrode and is composed of $(Ba_{1-x}M_x)(Ti_{1-y}Z_y)O_3$ (where (M=Sr or Ca and $0 \leq x \leq 0.3$) (Z=Zr or Hf and $0 \leq y \leq 0.2$)) that has pseudo-cubic (111) orientation. Further, a top electrode is formed on the piezoelectric layer.

The present invention constructs a piezoelectric actuator from a buffer layer of oxide or nitride that is epitaxially formed with a specified orientation on a Si substrate with a specified orientation, a bottom electrode that is formed on the buffer layer and is composed of metal or an oxide with a perovskite structure that has a specified orientation, a piezoelectric layer that is formed on the bottom electrode and is composed of pseudo-cubic $(Ba_{1-x}M_x)(Ti_{1-y}Z_y)O_3$ (M=Sr or Ca and $0 \leq x \leq 0.3$) (Z=Zr or Hf and $0 \leq y \leq 0.2$) with a specified orientation, and a top electrode formed on the piezoelectric layer, resulting in the effect that a piezoelectric actuator that has a similar level of performance to PZT can be provided.

In the first, second, third, or fourth aspects described above, the term "pseudo-cubic" for the pseudo-cubic $(Ba_{1-x}M_x)(Ti_{1-y}Z_y)O_3$ (where (M=Sr or Ca and $0 \leq x \leq 0.3$) (Z=Zr or Hf and $0 \leq y \leq 0.2$) refers to tetragonal crystals, orthorhombic crystals, and rhombohedral crystals. The amount of the polarization is smaller for tetragonal crystals, greater for orthorhombic crystals, and greatest for rhombohedral crystals. In contrast, the Young's modulus is greatest for tetragonal crystals, greater for orthorhombic crystals and smaller for rhombohedral crystals. As such, the piezoelectric characteristics are improved.

In the first or third aspect described above, it is preferable to use tetragonal $(Ba_{1-x}M_x)TiO_3$ (M=Sr or Ca and $0 \leq x \leq 0.3$) with (001) orientation as the pseudo-cubic $(Ba_{1-x}M_x)(Ti_{1-y}Z_y)O_3$ (M=Sr or Ca and $0 \leq x \leq 0.3$) (Z=Zr or Hf and $0 \leq y \leq 0.2$). This facilitates manufacturing and the Curie temperature (Tc) can be controlled by substituting Sr and Ca. It should be noted that when x>0.35, the crystals become cubic and piezoelectric characteristics are not exhibited. When $0.3 < x \leq 0.35$, there are two cases when the crystals are cubic and tetragonal, so that the reproducibility is poor. Accordingly, the range where $0 \leq x \leq 0.3$ is preferable. The range where $0.05 \leq x \leq 0.15$ is even more preferable. In these ranges, there is no phase transition near room temperature and the piezoelectric characteristics at room temperature are equivalent when x=0. It should be noted that for $(Ba_{1-x}M_x)(Ti_{1-y}Z_y)O_3$ (where x=0, $0 \leq y \leq 0.2$), (001) orientation orthorhombic $Ba(Ti_{1-y}Z_y)O_3$ or (100) orientation rhombohedral $Ba(Ti_{1-y}Z_y)O_3$ can be manufactured and is preferable.

In the second or fourth aspect described above, it is preferable to use (111) orientation tetragonal or rhombohedral or orthorhombic $Ba(Ti_{1-y}Z_y)O_3$ (Z=Zr or Hf and $0 \leq y \leq 0.2$) as the $(Ba_{1-x}M_x)(Ti_{1-y}Z_y)O_3$ (M=Sr or Ca and $0 \leq x \leq 0.3$) (Z=Zr or Hf and $0 \leq y \leq 0.2$). The crystal structures can be controlled so as to change from tetragonal to orthorhombic or rhombohedral by substituting Zr or Hr. Compared to tetragonal crystals, orthorhombic crystals and rhombohedral crystals have a low Young's modulus, so that superior piezoelectric characteristics can be expected. When y>0.2, even if crystal distortion is introduced epitaxially, the crystals will be cubic at room temperature, so that the range 0<y<0.2 is preferable.

In the first or third aspect described above, it is preferable to use, as the buffer layer that is composed of oxide or nitride that is formed epitaxially, at least one of (100) or (110) orientation SrO, MgO, BaO, CaO, or yttrium stabilized zirconia, $CeO_2$, $ZrO_2$, (001) orientation $YBa_2Cu_3O_y$, and TiN, or a solid solution that includes these substances. It is also preferable to use, as the bottom electrode that is formed on the buffer layer and is composed of a transition metal oxide having a pseudo-cubic (100) orientation with a perovskite structure, at least one of $CaRuO_3$, $SrRuO_3$, $BaRuO_3$, $SrVO_3$, $(La,Sr)MnO_3$, $(La,Sr)CrO_3$, $(La,Sr)CoO_3$, and a solid solution that includes these substances. This is because such a composition facilitates the formation of a piezoelectric layer with the specified orientation.

In the second or fourth aspect described above, it is preferable to use, as the buffer layer that is composed of oxide or nitride that is formed epitaxially, at least one of a (111) orientation SrO, MgO, BaO, or CaO, or a rare earth oxide such as $Y_2O_3$, $Sc_2O_3$, $Yb_2O_3$, $Dy_2O_3$, $Ho_2O_3$, and $Er_2O_3$. Further, TiN and a solid solution that includes these substances may also be used. In addition, it is preferable to use as the bottom electrode that is formed on the buffer layer a transition metal oxide that has a pseudo-cubic (111) orientation with a perovskite structure composed of at least one of $CaRuO_3$, $SrRuO_3$, $BaRuO_3$, $SrVO_3$, $(La,Sr)MnO_3$, $(La,Sr)CoO_3$, $(La,Sr)CoO_3$, and a solid solution that includes these substances. This is because such a composition facilitates the formation of a piezoelectric layer with the specified orientation.

In the third or fourth aspect described above, it is preferable for the metal mentioned above to be Pt, Ir or Ru. This is because the formation of a metal bottom electrode with the specified orientation on oxide or nitride with the specified orientation is facilitated.

In the first, second, third or fourth aspect described above, it is preferable to provide a film of amorphous silicon oxide between the Si substrate and the buffer layer. This is because the silicon oxide film functions as an etching stopper layer for the Si substrate and also as a diaphragm for the actuator.

The fifth aspect of the present invention is an ink jet head that includes the piezoelectric actuator of any of the first to fourth aspects described above, wherein the Si substrate is provided with ink chambers that are constructed so as to have a volume that varies according to vibrations of a diaphragm provided in the piezoelectric actuator. The diaphragm is composed of the buffer layer, the bottom electrode, the piezoelectric layer and the silicon oxide film (when a silicon oxide film is provided).

With the above construction, it is possible to provide an ink jet head that has favorable performance and does not use PZT.

The sixth aspect of the present invention is a discharge apparatus that includes the ink jet head of the fifth aspect described above as a printing means. With this construction, it is possible to provide a discharge apparatus that has favorable performance and does not use PZT.

In the above piezoelectric actuator, when strontium ruthenate is used as the bottom electrode, it is preferable for a layer composed of $SrRuO_3$ to be provided on at least the piezoelectric layer side of this strontium ruthenate. By doing so, it is possible to sufficiently maintain the conductivity of the bottom electrode and the ability to control the orientation of the piezoelectric film.

In the above piezoelectric actuator it is preferable for the Si substrate to have a (100), (110), or a (111) orientation. With this construction, the orientation of the oxide, such as SrO, or the TiN can be more favorably controlled.

The ink jet head of the present invention includes the piezoelectric actuator described above, wherein the Si substrate is provided with ink chambers that are constructed so as to have a volume that varies according to vibrations of the buffer layer provided in the piezoelectric actuator.

The discharge apparatus of the present invention, for example a printer, includes the ink jet head described above as a printing means.

DETAILED DESCRIPTION OF THE PREFERRED EMBODIMENTS

Overall Construction of an Ink Jet Printer

Figure 1:
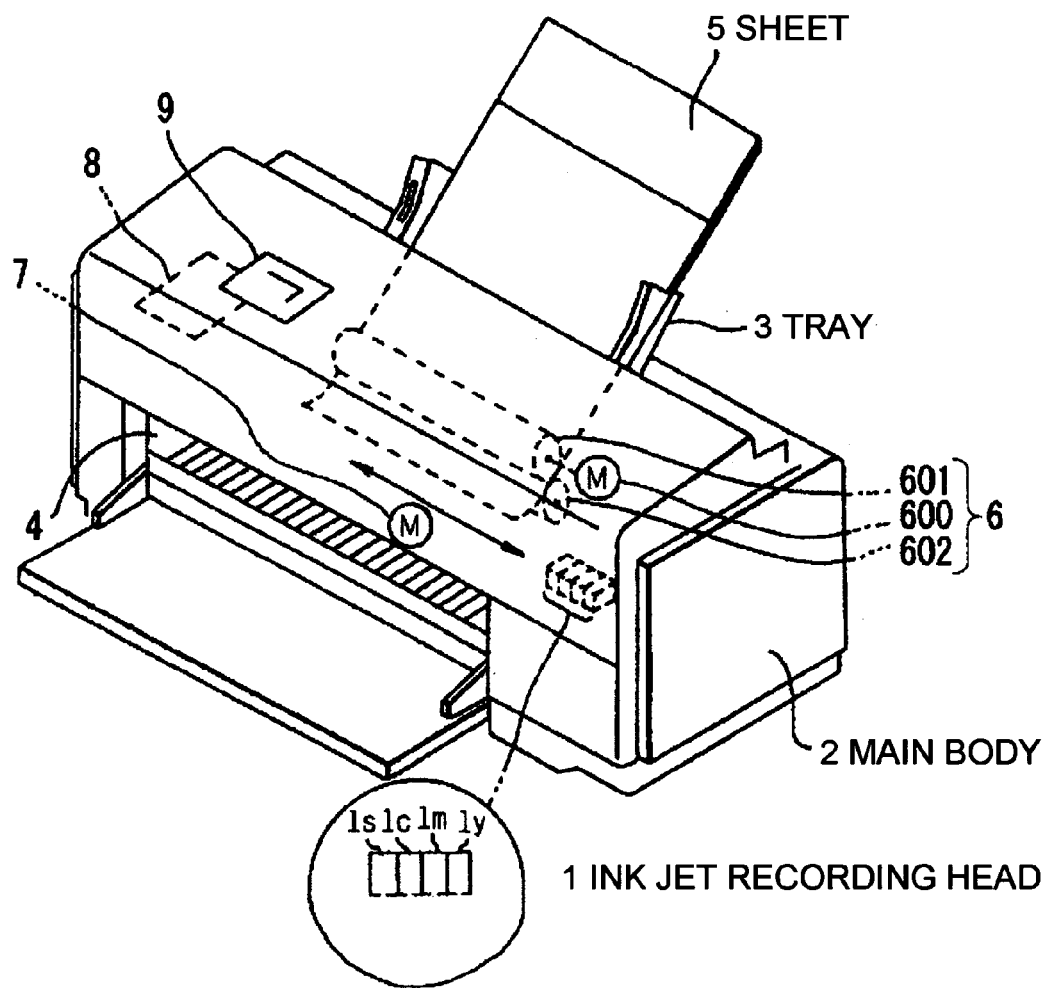
FIG. 1 is a block diagram showing an ink jet printer that is equipped with a piezoelectric actuator according to an embodiment of the present invention.

FIG. 1 is a block diagram showing an ink jet printer that is equipped with a piezoelectric actuator according to an embodiment of the present invention. This ink jet printer is mainly composed of an ink jet head 1, a main body 2, a tray 3, and a head driving mechanism 7.

The ink jet head 1 includes ink cartridges for a total of four colors, such as yellow, magenta, cyan, and black, for example. Moreover, the ink jet head 1 is constructed so as to be capable of full-color printing although the types and number of ink cartridges are not particularly limited to this example. More particularly, 5 to 7, or even more cartridges or types of cartridges may be used. This ink jet printer is also internally equipped with a dedicated controller board or the like which controls the ink discharge timing of the ink jet head 1 and the scanning of the head driving mechanism 7.

The construction of the ink jet head of the present embodiment can also be adapted to a liquid discharge mechanism of various types of industrial liquid discharging apparatuses, for example. In such cases, aside from the inks (color dyes or pigment inks for yellow, magenta, cyan, and black, etc.) described above, it is possible to use liquids and substances in liquid form that have a suitable viscosity for discharge from the nozzles (liquid discharge openings) of the liquid discharge mechanism.

The tray 3 is provided on the rear surface of the main body 2 and an auto sheet feeder (automatic consecutive feeding mechanism) 6 is provided inside the main body 2. A recording sheet 5 is automatically transported and the recording sheet 5 is discharged from a discharge slot 4 in the front surface of the main body 2.

Overall Construction of the Ink Jet Head

Figure 2:
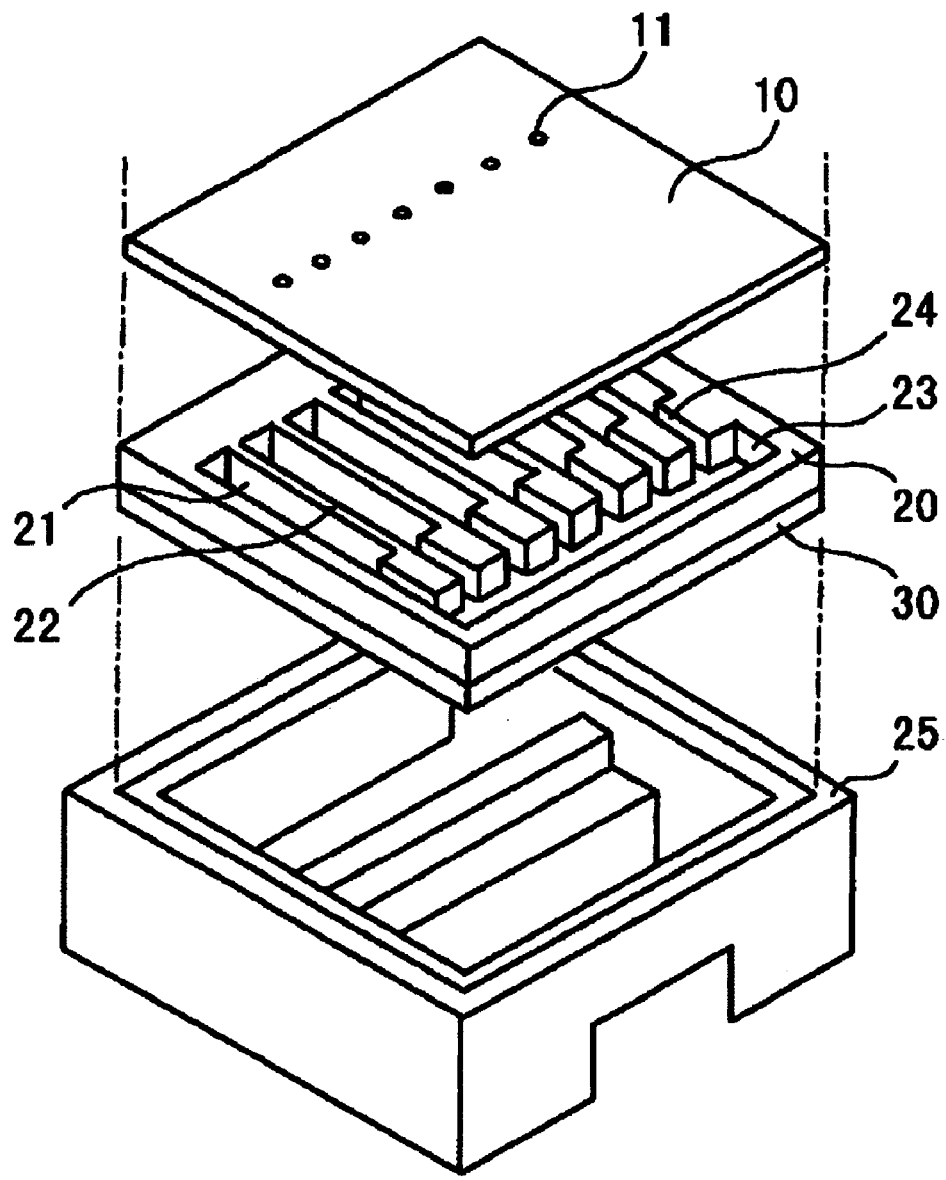
FIG. 2 is an exploded perspective view showing an ink jet head.

FIG. 2 is an exploded perspective view showing the ink jet head described above. The ink jet head 1 is constructed so as to include an ink chamber substrate (Si substrate) 20, a buffer layer 30 that is fixed to one surface of the ink chamber substrate 20, and a nozzle plate 10 that is fixed to another surface of the ink chamber substrate 20. This head 1 is constructed as an "on-demand"-type piezo jet head.

The ink chamber substrate 20 includes ink chambers ("cavities" or "pressure chambers") 21, side walls (partition walls) 22, a reservoir 23, and supply openings 24. The ink chambers 21 are spaces that store ink or the like to be discharged. The side walls 22 are formed so as to divide the ink chamber substrate 20 into a plurality of ink chambers 21. The reservoir 23 forms a channel for filling each ink chamber 21 with the same ink. The supply openings 24 are formed so as to introduce ink from the reservoir 23 into the ink chambers 21.

The nozzle plate 10 is disposed onto the ink chamber substrate 20 so that nozzle holes 11 of the nozzle plate 10 are disposed at positions corresponding to each of the ink chambers 21 provided in the ink chamber substrate 20. The ink chamber substrate 20 on which the nozzle plate 10 has been disposed is enclosed in a case 25.

Piezoelectric actuators (described later) are provided on the buffer layer 30. An ink tank opening (not shown in the drawing) is provided in the buffer layer 30 so that ink that is stored in an ink tank, which is also not illustrated, can be supplied to the reservoir 23.

Stacked Structure

Figure 3:
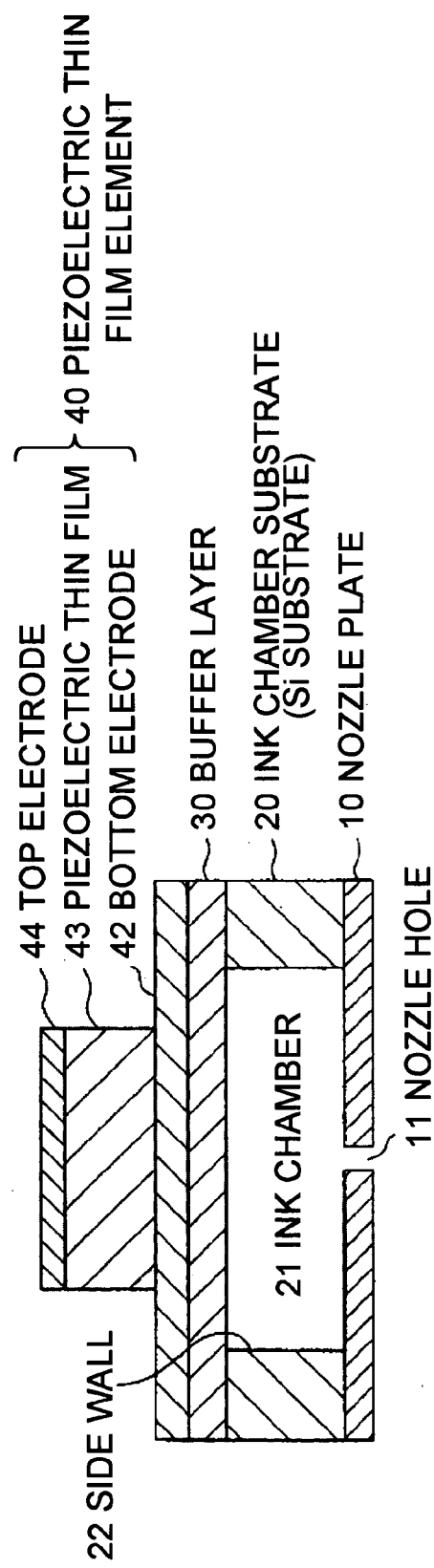
FIG. 3 is a cross-sectional view showing the stacked structure of the ink jet head and the piezoelectric actuator manufactured according to the manufacturing method of the present invention.

FIG. 3 is a cross-sectional view showing the stacked structure of the ink jet head and the piezoelectric actuators manufactured according to the manufacturing method of the present invention. As shown in the FIG. 3, piezoelectric actuators are constructed with the buffer layer 30, a bottom electrode 42, a piezoelectric thin film 43, and a top electrode 44 stacked in order on a Si substrate 20 with either (100), (110), or (111) orientation. The bottom electrode 42, the piezoelectric thin film 43, and the top electrode 44 compose a piezoelectric thin film element 40.

The buffer layer 30 has a function of deforming due to deformation in the piezoelectric layer so as to instantaneously increase the pressure inside the ink chambers 21. The buffer layer 30 is composed of strontium oxide (SrO) with (110) or (100) orientation (preferably (110) orientation) that is formed on a Si substrate with (100) orientation. This SrO is suited to the epitaxial growth of the bottom electrode 42 of $CaRuO_3$, $SrRuO_3$, $BaRuO_3$, $SrVO_3$, $(La,Sr)MnO_3$, $(La,Sr)CrO_3$, or $(La,Sr)CoO_3$ etc. that are perovskite structures with pseudo-cubic (100) orientation. In particular, by epitaxially forming the SrO, crystal lattices of SrO with (110) or (100) orientation can be regularly aligned on a Si substrate with (100) orientation, so that the buffer layer 30 can be made especially suited to the formation upon it of a bottom electrode 42 that has a perovskite structure with (100) orientation.

In place of the SrO mentioned above, MgO, BaO or CaO (which can be epitaxially grown with (110) or (100) orientation on a Si substrate with (100) orientation) can be used. Also, the buffer layer 30 can be made especially suited to having a bottom electrode 42 of a perovskite structure with (100) orientation formed upon it by successively depositing yttrium stabilized zirconia (hereinafter "YSZ") with (100) orientation and $CeO_2$ as the buffer layer 30 and then further depositing $YBa_2Cu_3O_y$ with (001) orientation on the top of this. This is also the case when $ZrO_2$ is used is place of YSZ. (YSZ, $ZrO_2$ can be epitaxially grown with (100) orientation on a (100) Si substrate, can have $CeO_2$ epitaxially grown on top with (100) orientation, and can then have $YBa_2Cu_3O_y$ epitaxially grown on top with (001) orientation.)

The buffer layer 30 mentioned above is formed as a layer while irradiating with an ion beam, so that epitaxial growth can be performed with the same orientation on an amorphous silicon oxide layer formed through thermal oxidization in the surface of the Si substrate 20 with (110) orientation.

It should be noted that when the strontium ruthenium oxide (SRO) mentioned above is used, for example, as the bottom electrode 42, the SRO has a perovskite structure and is expressed as $Sr_{n+1}Ru_nO_{3n+1}$ (where n is an integer that is one or greater). When n=1, the SRO is $Sr_2RuO_4$, where n=2, the SRO is $Sr_3Ru_2O_7$, and when n=∞, the SRO is $SrRuO_3$. When SRO is used as the bottom electrode mentioned above, $SrRuO_3$ is most preferable since this raises the conductivity and the crystallization of the piezoelectric thin film.

The buffer layer 30 may also be formed of strontium oxide (SrO) with (111) orientation that is formed on a Si substrate with (111) orientation. Such SrO is suited to the epitaxial growth of an SRO bottom electrode 42 with a (111) orientation perovskite structure. In particular, by epitaxially forming the SrO, the crystal lattices of the SrO with (111) orientation become regularly aligned on the Si substrate with (111) orientation, which makes the buffer layer 30 especially suited to the formation upon it of an SRO bottom electrode 42 with a (111) orientation perovskite structure.

In place of the SrO mentioned above, MgO, BaO, CaO or a rare earth oxide (it is possible for these substances to be epitaxially grown with (111) orientation on a Si substrate with (111) orientation) can be used.

In addition, the buffer layer may be a TiN layer that is epitaxially grown with (100) orientation on a (100) orientation Si substrate or a TiN layer that is epitaxially grown with (111) orientation on a (111) orientation Si substrate.

A surface of the buffer layer that is a TiN layer which has been epitaxially formed with (100) orientation is suited to the epitaxial growth of a metal bottom electrode 42 with (100) orientation.

A surface of buffer layer that is a TiN layer which has been epitaxially formed with (111) orientation is suited to the epitaxial growth of a metal bottom electrode 42 with (111) orientation.

Pt, Ir, or Ru is preferable as the metal mentioned above.

The bottom electrode 42 is one of the electrodes that applies a current to the piezoelectric thin film 43 and is formed in the same region as the buffer layer 30 so as to function as a common electrode for the plurality of piezoelectric thin film elements formed on the ink chamber substrate 20. However, the bottom electrode 42 can be formed in the same size as the piezoelectric thin film 43, which is to say in the same shape as the top electrode. The bottom electrode 42 is composed from a conductive metal oxide, in particular $CaRuO_3$, $SrRuO_3$, $BaRuO_3$, $SrVO_3$, $(La,Sr)MnO_3$, $(La,Sr)CrO_3$, or $(La,Sr)CoO_3$ etc. that are perovskite structures with pseudo-cubic (100) orientation or (111) orientation, or from a metal selected from Pt, Ir, and Ru. These substances are suited to a base layer for epitaxially growing a thin film of $BaTiO_3$ of the piezoelectric thin film 43. In place of an oxide electrode with a single-layer construction, a construction where a layer of iridium or platinum is sandwiched between two oxide electrode layers may be used. When, in this way, a construction wherein a layer of iridium or platinum is sandwiched between two layers of SRO, for example, is used, it is particularly preferable for the SRO layer on the piezoelectric thin film side to be $SrRuO_3$.

The piezoelectric thin film 43 is a piezoelectric ceramic that has a perovskite crystal structure, and is formed in a predetermined shape on the bottom electrode 42. The piezoelectric thin film 43 is pseudo-cubic $(Ba_{1-x}M_x)(Ti_{1-y}Z_y)O_3$ (M=Sr or Ca and $0 \leq x \leq 0.3$) (Z=Zr or Hf and $0 \leq y \leq 0.2$). Such crystals have (001) orientation or (111) orientation. By introducing crystal distortions through epitaxial growth, it is also possible to control Tc.

The top electrode 44 is the other electrode for applying a voltage to the piezoelectric thin film 43 and is constructed of a conductive material, such as platinum (Pt), iridium (Ir), aluminum (Al), or the like. When aluminum is used, a layer of iridium or the like is also formed as a countermeasure against galvanic corrosion.

Operation of the Ink Jet Head

The following describes the operation of the ink jet head 1 described above. When a predetermined discharge signal is not supplied and a voltage is not applied across the bottom electrode 42 and the top electrode 44 of the piezoelectric thin film element 40, no deformation occurs in the piezoelectric thin film 43. When the discharge signal is not supplied to the piezoelectric thin film element 40, the ink chambers 21 do not deform under pressure and ink droplets are not discharged from the nozzle holes 11.

On the other hand, when a predetermined discharge signal is supplied and a fixed voltage has been applied across the bottom electrode 42 and the top electrode 44 of the piezoelectric thin film element 40, deformation occurs in the piezoelectric thin film 43. When the discharge signal has been supplied to the piezoelectric thin film element 40, the buffer layer 30 of the ink chambers 21 bends greatly. This means that there is an instantaneous rise in the pressure in the ink chambers 21 and ink droplets are discharged from the nozzle holes 11. By separately supplying discharge signals to piezoelectric elements at positions on a slim-line head where printing is desired, the desired characters and figures can be printed.

Manufacturing Method

Figure 4:
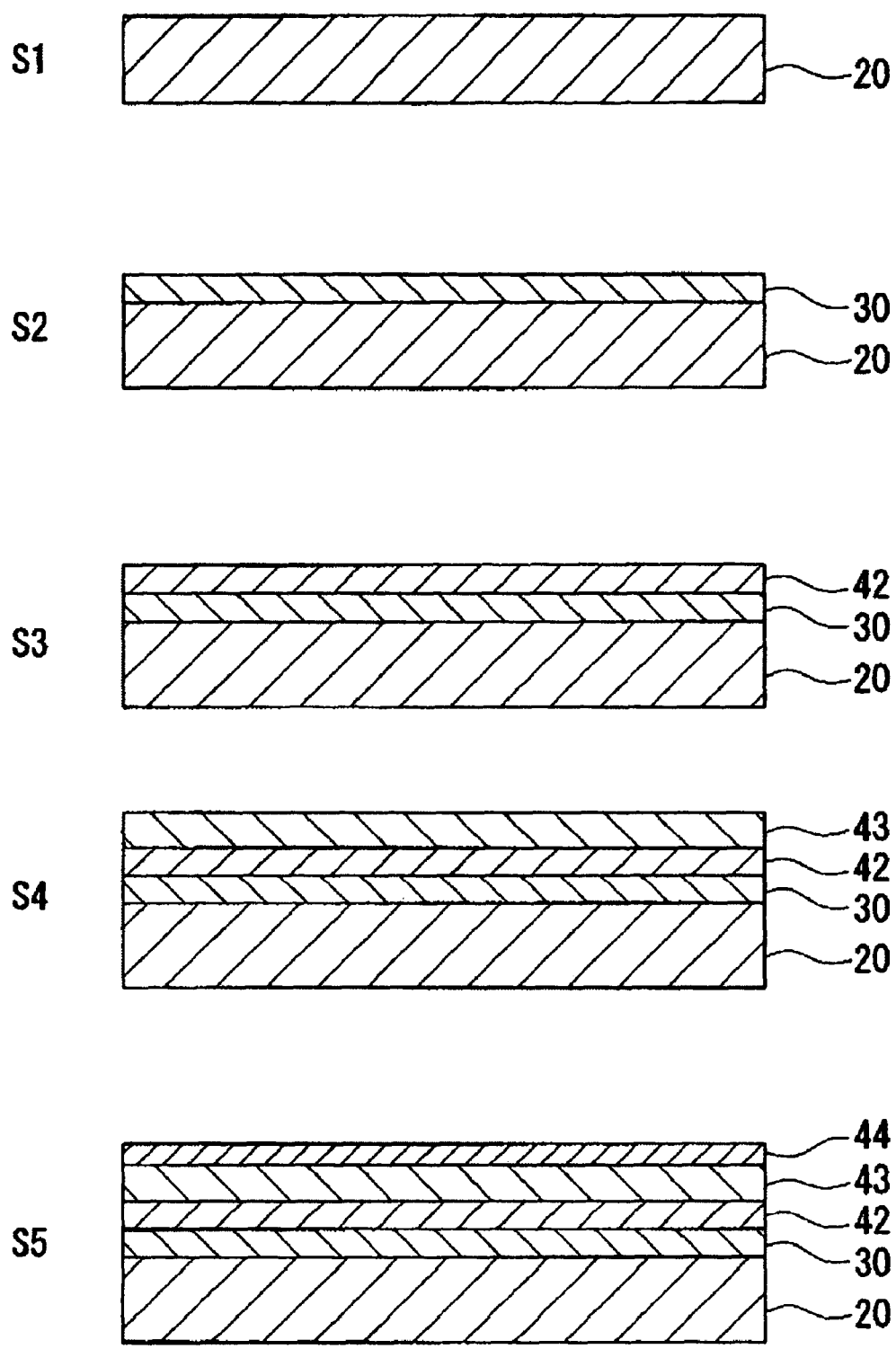
FIG. 4 is a series of cross-sectional views showing each step in the manufacturing process of the piezoelectric actuator of the present embodiment.

The following describes the manufacturing method of the piezoelectric actuator of the present embodiment and also the manufacturing method of the ink jet head, with reference to FIG. 4.

Substrate (S1)

The piezoelectric actuator of the present embodiment is manufactured by forming the buffer layer 30, the bottom electrode 42, the piezoelectric thin film 43, and the top electrode 44 in layers on the Si substrate 20 shown in FIG. 4 (S1). As one example, a single-crystal silicon substrate with (100), (110), or (111) orientation, a diameter of 100 mm, and a thickness of 200 μm is used as the ink chamber substrate 20. It should be noted that when an amorphous silicon oxide film is formed on the surface of a (100) or (110) substrate, thermal oxidization is used.

Formation of the Buffer Layer (S2)

As shown in FIG. 4 (S2), a buffer layer 30 composed of SrO (or MgO, BaO, CaO, or YSZ, $CeO_2$, $ZrO_2$, (001) orientation $YBa_2Cu_3O_y$, or TiN) is formed on the Si substrate 20 by epitaxial growth. When the Si substrate 20 has (100) or (110) orientation, an SrO film with (110) or (100) orientation can be formed by controlling the film formation conditions. When the Si substrate 20 has (111) orientation, a film of SrO (or MgO, BaO, CaO, or a rare earth oxide or TiN) with (111) orientation can be formed.

Aside from laser abrasion, a method such as molecular beam epitaxy (MBE), MOCVD, and sputtering may be used to epitaxially form the buffer layer 30. When epitaxial formation is performed on a film of amorphous silicon oxide, such formation may be performed while irradiating the substrate surface with an ion beam. When a film of SrO (or MgO, BaO, CaO or TiN) is formed, it is also preferable to dope the layer with silicon or boron.

Formation of the Bottom Electrode (S3)

As shown in FIG. 4 (S3), the bottom electrode 42 is formed as a film on the buffer layer 30. As the bottom electrode 42, SRO mentioned above or an SRO/Pt/SRO or SRO/Ir/SRO stacked structure is formed in a layer with a total thickness of around 500 nm. As one example, in the case of SRO, laser abrasion is used as the method of forming a film. However, this is not a limitation, and any known thin film manufacturing method, such as MOCVD, for example, may be used.

In place of the SRO mentioned above, $CaRuO_3$, $BaRuO_3$, $SrVO_3$, $(La,Sr)MnO_3$, $(La,Sr)CrO_3$, or $(La,Sr)CoO_3$, or a metal such as Pt, Ir, or Ru may also be used.

Formation of the Piezoelectric Thin Film (S4)

Next, as shown in FIG. 4 (S4), the piezoelectric thin film 43 is formed as a film on the bottom electrode 42. Here, a film of pseudo-cubic $(Ba_{1-x}M_x)(Ti_{1-y}Z_y)O_3$ (M=Sr or Ca and $0 \leq x \leq 0.3$) (Z=Zr or Hf and $0 \leq y \leq 0.2$) is formed by a sol-gel method, for example. This is to say, a metal organic compound, such as a metal alkoxide, is hydrolyzed with liquid solution and subjected to polycondensation to form a layer of piezoelectric precursor film that is an amorphous film, and this is then fired to crystallize the layer. Alternatively, the thin film may be formed by laser abrasion, sputtering, MOCVD, etc.

The pseudo-cubic $(Ba_{1-x}M_x)(Ti_{1-y}Z_y)O_3$ (M=Sr or Ca and $0 \leq x \leq 0.3$) (Z=Zr or Hf and $0 \leq y \leq 0.2$) is grown to a crystal with being affected by the crystal structure of the SRO or metal (such as Pt) bottom electrode. In the present embodiment, when a film of pseudo-cubic $(Ba_{1-x}M_x)(Ti_{1-y}Z_y)O_3$ (M=Sr or Ca and $0 \leq x \leq 0.3$) (Z=Zr or Hf and $0 \leq y \leq 0.2$) is formed on SRO with (100) orientation, an epitaxial thin film of pseudo-cubic $(Ba_{1-x}M_x)(Ti_{1-y}Z_y)O_3$ (where (M=Sr or Ca and $0 \leq x \leq 0.3$) (Z=Zr or Hf and $0 \leq y \leq 0.2$) is formed with (001) orientation (in the case of rhombohedral crystals, (100) orientation). When a film of pseudo-cubic $(Ba_{1-x}M_x)(Ti_{1-y}Z_y)O_3$ (M=Sr or Ca and $0 \leq x \leq 0.3$) (Z=Zr or Hf and $0 \leq y \leq 0.2$) is formed on SRO with (111) orientation, an epitaxial thin film of pseudo-cubic $(Ba_{1-x}M_x)(Ti_{1-y}Z_y)O_3$ (M=Sr or Ca and $0 \leq x \leq 0.3$) (Z=Zr or Hf and $0 \leq y \leq 0.2$) is formed with (111) orientation. The thickness of the piezoelectric thin film is 0.5 μm or above, and may be 1 μm or above and 2 μm or below, for example.

Formation of the Top Electrode (S5)

Next, as shown in FIG. 4 (S5), the top electrode 44 is formed on the piezoelectric thin film 43. More specifically, as one example, a layer of platinum (Pt) that is around 50 nm thick is formed by DC sputtering.

Formation of the Piezoelectric Actuators

Figure 5:
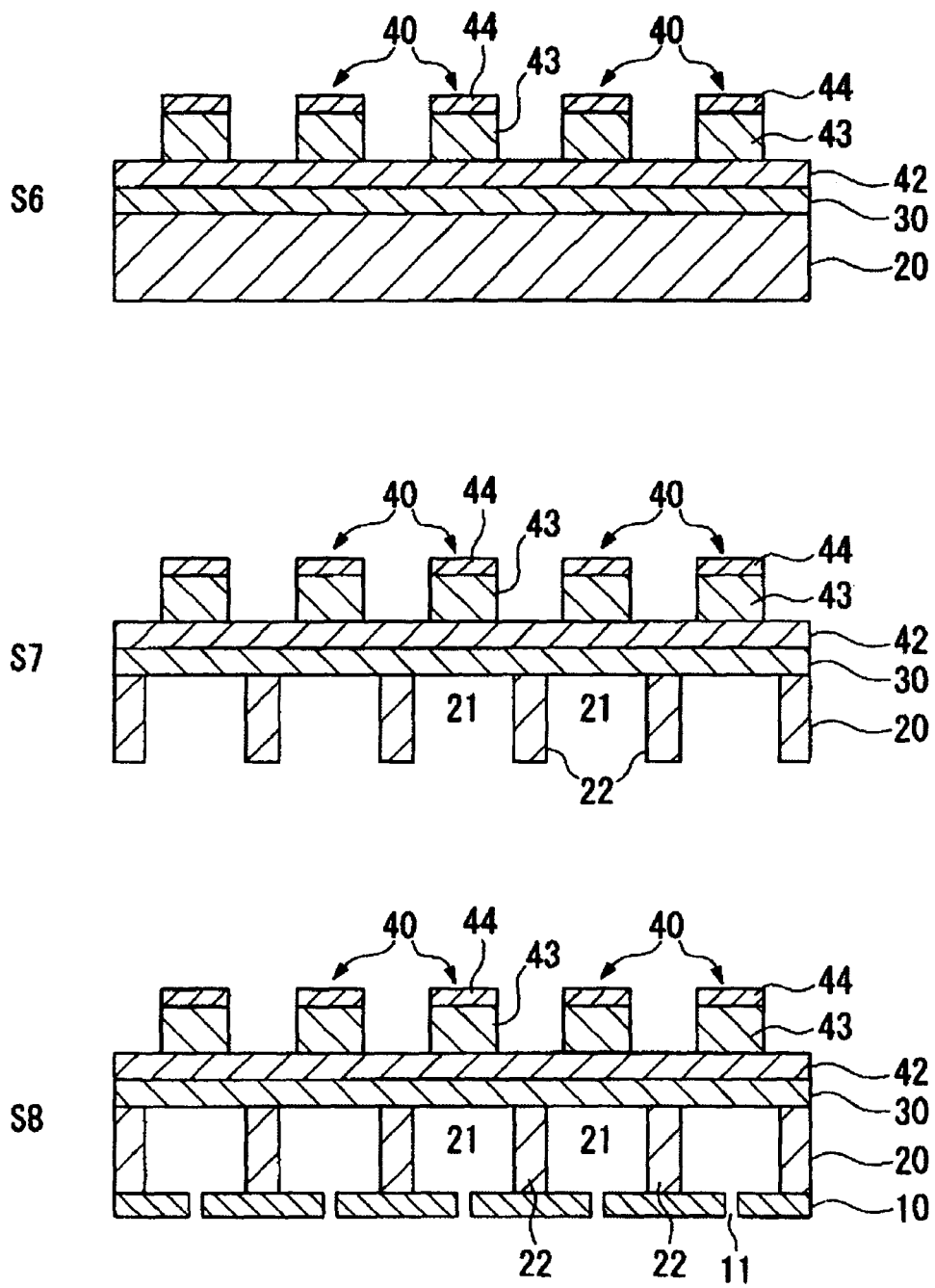
FIG. 5 is a series of cross-sectional views showing each step in the manufacturing process of the ink jet head of the present embodiment.

As shown by FIG. 5 (S6), the top electrode 44 and the piezoelectric thin film 43 are processed into predetermined shapes to form the piezoelectric actuators. More specifically, a resist is coated onto the top electrode 44 by spinning and then patterned by exposing and developing in accordance with the positions at which the ink chambers should be formed. The remaining resist is used as a mask and the top electrode 44 and the piezoelectric thin film 43 are etched by ion milling or the like. Piezoelectric actuators that include the piezoelectric thin film elements 40 are formed by the above process.

Conventionally, the piezoelectric constant $d_{31}$ of a polycrystal PZT that is manufactured by a sol-gel method has been around 200 pC/N. The $d_{31}$ of the pseudo-cubic $(Ba_{1-x}M_x)(Ti_{1-y}Z_y)O_3$ (M=Sr or Ca and $0 \leq x \leq 0.3$) (Z=Zr or Hf and $0 \leq y \leq 0.2$) manufactured by the above method is 200 pC/N or above.

Formation of the Ink Jet Head

As shown in FIG. 5 (S7), ink chambers 21 are formed in the ink chamber substrate 20. When a (100) orientation Si substrate is used as the ink chamber substrate 20, dry etching is used as the method of forming the ink chambers 21, when a (110) orientation Si substrate is used as the ink chamber substrate 20, anisotropic etching is used, and when a (111) orientation Si substrate is used as the ink chamber substrate 20, dry etching is used. The remaining parts that have not been etched form the side walls 22.

Finally, as shown by (S8) in FIG. 5, the nozzle plate 10 and the ink chamber substrate 20 are joined using resin or the like. When the nozzle plate 10 is joined to the ink chamber substrate 20, alignment is performed so that the nozzle holes 11 are disposed corresponding to each of the cavities of the ink chambers 21. An ink jet head is formed by the above process.

The present invention provides a piezoelectric actuator with high performance that does not include Pb and uses barium titanate as the piezoelectric body. The present invention also provides an ink jet head and discharge apparatus that use such piezoelectric actuators.

What is claimed is:

1. A piezoelectric actuator comprising:
a buffer layer formed on a Si substrate with (100) or (110) orientation, said buffer layer composed of an epitaxially formed oxide;
a bottom electrode formed on the buffer layer composed of a transition metal oxide having a pseudo-cubic (100) orientation with a perovskite structure;
a piezoelectric layer formed on the bottom electrode composed of $(Ba_{1-x}M_x)(Ti_{1-y}Z_y)O_3$ (where (M=Sr or Ca and $0.05 \leq x \leq 0.15$) and (Z=Zr or Hf and y=0.2)) with a pseudo-cubic (001) orientation; and
a top electrode formed on the piezoelectric layer.

2. A piezoelectric actuator comprising:
a buffer layer formed on a Si substrate, said buffer layer composed of an epitaxially formed oxide;
a bottom electrode formed on the buffer layer composed of a transition metal oxide having a pseudo-cubic (111) orientation with a perovskite structure;
a piezoelectric layer formed on the bottom electrode composed of $(Ba_{1-x}M_x)(Ti_{1-y}Z_y)O_3$ (where (M=Sr or Ca and $0.05 \leq x \leq 0.15$) and (Z=Zr or Hf and y=0.2)) that has pseudo-cubic (111) orientation; and
a top electrode formed on the piezoelectric layer.

3. A piezoelectric actuator comprising:
a buffer layer formed on a Si substrate with (100) or (110) orientation, said buffer layer composed of an oxide or an epitaxially formed nitride;
a bottom electrode formed on the buffer layer including a metal with (100) orientation;
a piezoelectric layer formed on the bottom electrode composed of $(Ba_{1-x}M_x)(Ti_{1-y}Z_y)O_3$ (where (M=Sr or Ca and $0.05 \leq x \leq 0.15$) and (Z=Zr or Hf and y=0.2)) having a pseudo-cubic (001) orientation; and
a top electrode formed on the piezoelectric layer.

4. A piezoelectric actuator comprising:
a buffer layer formed on a Si substrate, said buffer layer composed of an oxide or an epitaxially formed nitride;
a bottom electrode formed on the buffer layer including a metal with (111) orientation;
a piezoelectric layer formed on the bottom electrode composed of $(Ba_{1-x}M_x)(Ti_{1-y}Z_y)O_3$ (where (M=Sr or Ca and $0.05 \leq x \leq 0.15$) and (Z=Zr or Hf and y=0.2)) having a pseudo-cubic (111) orientation; and
a top electrode formed on the piezoelectric layer.

5. A piezoelectric actuator according to claim 3, wherein the metal is selected from the group consisting of Pt, Ir, and Ru.

6. A piezoelectric actuator according to claim 1, further comprising a film of amorphous silicon oxide between the Si substrate and the buffer layer.

7. An ink jet head, comprising the piezoelectric actuator disclosed in claim 1,
wherein the Si substrate is provided with ink chambers that are constructed so as to enable a volume to vary according to vibrations of a diaphragm provided in the piezoelectric actuator.

8. A discharge apparatus that is provided with the ink jet head disclosed in claim 7 as a printing means.

9. A piezoelectric actuator according to claim 2,
further comprising a film of amorphous silicon oxide between the Si substrate and the buffer layer.

10. A piezoelectric actuator according to claim 4, wherein the metal is selected from the group consisting of Pt, Ir, and Ru.

11. An ink jet head, comprising the piezoelectric actuator disclosed in claim 2,
wherein the Si substrate is provided with ink chambers that are constructed so as to enable a volume to vary according to vibrations of a diaphragm provided in the piezoelectric actuator.

12. An ink jet head, comprising the piezoelectric actuator disclosed in claim 3,
wherein the Si substrate is provided with ink chambers that are constructed so as to enable a volume to vary according to vibrations of a diaphragm provided in the piezoelectric actuator.

13. An ink jet head, comprising the piezoelectric actuator disclosed in claim 4,
wherein the Si substrate is provided with ink chambers that are constructed so as to enable a volume to vary according to vibrations of a diaphragm provided in the piezoelectric actuator.

* * * * *